(12) United States Patent
Khayat

(10) Patent No.: US 12,132,489 B2
(45) Date of Patent: Oct. 29, 2024

(54) SLEW-RATE CONTROL FOR TRANSISTORS

(71) Applicant: TEXAS INSTRUMENTS INCORPORATED, Dallas, TX (US)

(72) Inventor: Joseph M. Khayat, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/157,288

(22) Filed: Jan. 20, 2023

(65) Prior Publication Data
US 2024/0250672 A1 Jul. 25, 2024

(51) Int. Cl.
*H03K 5/04* (2006.01)
*H03K 3/012* (2006.01)
*H03K 5/08* (2006.01)
*H03K 17/687* (2006.01)

(52) U.S. Cl.
CPC ............... *H03K 5/04* (2013.01); *H03K 3/012* (2013.01); *H03K 5/08* (2013.01); *H03K 17/6871* (2013.01)

(58) Field of Classification Search
None
See application file for complete search history.

(56) References Cited

U.S. PATENT DOCUMENTS 6,025,705 A * 2/2000 Nguyen ............... H02M 3/1588
363/17

* cited by examiner

*Primary Examiner* — Jeffrey S Zweizig
(74) *Attorney, Agent, or Firm* — Charles F. Koch; Frank D. Cimino

(57) ABSTRACT

A circuit includes an avalanche diode having an anode and a cathode. The circuit also includes a buffer stage having a buffer input, a power input and a buffer output, in which the buffer input is coupled to the anode, and the cathode is coupled to the power input. The circuit includes a transistor coupled between the power input and a clamp output. The transistor has a control input coupled to the buffer output, and a loop circuit is coupled between the buffer output and the buffer input. A capacitor is coupled between the buffer input and an output terminal.

20 Claims, 4 Drawing Sheets

SLEW-RATE CONTROL FOR TRANSISTORS

TECHNICAL FIELD

This description relates to slew-rate control for transistors.

BACKGROUND

Power converters are used in variety of applications to supply electrical power. As an example, switching regulators include an arrangement of switches, such as power transistors, configured to convert electrical power from one form to another and provide a regulated voltage at an output terminal. The switching regulator is designed to maintain the regulated output voltage over a range of operating conditions, including at startup as well as under changing load conditions. Some applications specify maximum or minimum slew rates to control the speed of signal transitions for ensuring operation within expected operating parameters. Accordingly, circuits can implement slew rate control to achieve the combination of maintaining the power transistor within its recommended operating conditions while also reducing the switching power losses of the power converter.

SUMMARY

One described example is directed to a circuit that includes an avalanche diode having an anode and a cathode. The circuit also includes a buffer stage having a buffer input, a power input and a buffer output, in which the buffer input is coupled to the anode, and the cathode is coupled to the power input. The circuit includes a transistor coupled between the power input and a clamp output. The transistor has a control input coupled to the buffer output, and a loop circuit is coupled between the buffer output and the buffer input. A capacitor is coupled between the buffer input and an output terminal.

Another example circuit includes a buffer stage coupled between an input terminal and an output terminal. The buffer stage is configured to provide a buffer signal responsive to a voltage at the input terminal, a voltage at the output terminal, and the buffer stage is configured to turn on at a rate that depends on a capacitance at a buffer input. An avalanche diode is coupled between the buffer input and the input terminal, and is configured to conduct a reverse bias current responsive to a voltage at the input terminal exceeding a breakdown voltage of the diode. A loop circuit is configured to control the buffer stage and bias the avalanche diode responsive to operation of the buffer stage. A capacitor is coupled between the buffer input and the output terminal. A clamping transistor is configured to clamping signal responsive to the voltage at the output terminal and the buffer signal.

Another described example provides a system that includes a first transistor, a driver and a clamp circuit. The first transistor has a first control input and is coupled between an input terminal and an output terminal. The driver has a driver output coupled to the first control input. The clamp circuit includes a second transistor, an avalanche diode, a buffer stage and a loop circuit. The second transistor has a second control input, and the second transistor is coupled between the input terminal and the first control input. The avalanche diode has an anode and a cathode, in which the cathode coupled to the input terminal. The buffer stage has a buffer input, a power input and a buffer output. The buffer input is coupled to the anode. The power input is coupled to the input terminal, and the buffer output is coupled to the second control input. The loop circuit is coupled between the buffer output and the buffer input, and a capacitor is coupled between the buffer input and the output terminal.

DETAILED DESCRIPTION

This description relates to slew rate control, such as in an active drain-to-source clamping circuit of a switching power transistor, to mitigate excessive ringing during a switching phase of the power transistor. For example, a circuit described herein can be configured to provide an active voltage clamp having an adjustable slew rate, such as for actively clamping a power transistor in a power converter output stage when the power transistor is being turned off.

As an example, an active clamp circuit includes an avalanche diode, a buffer stage and a clamping transistor. The avalanche diode is coupled between an input terminal and a buffer input of the buffer stage. The buffer stage is coupled between the avalanche diode and the clamping transistor. The buffer stage can also include a current feedback circuit coupled between the buffer input and a buffer output, and the buffer output is coupled to a control input of the clamping transistor. The buffer stage and avalanche diode are configured to perform sensing and slew control functions for the clamping transistor. A variable capacitor, which is coupled between the buffer input and the output terminal, can be configured to control slew rate of the active clamp circuit. For example, a capacitance of the variable capacitor can be configured depending on operating conditions of a power circuit, such as based on an input supply voltage, load current or other conditions of the power circuit. The variable capacitor at the buffer input a can be used to control the slew rate of a transistor responsive to circuit operating conditions. For example, at lower input voltage conditions, the variable capacitor at the buffer input can be configured to a higher capacitance to enable fast switch operation. By decreasing the response time of the active clamp, efficiency increases. At high input supply voltage conditions (e.g., near a maximum rated input voltage), the variable capacitor at the buffer input can be configured to a lower capacitance to improve (e.g., speed up) the response time of the active clamp, thus reducing the slew rate of the switching phase of the power transistor to maintain the power transistor in its safe operating area.

Figure 1:
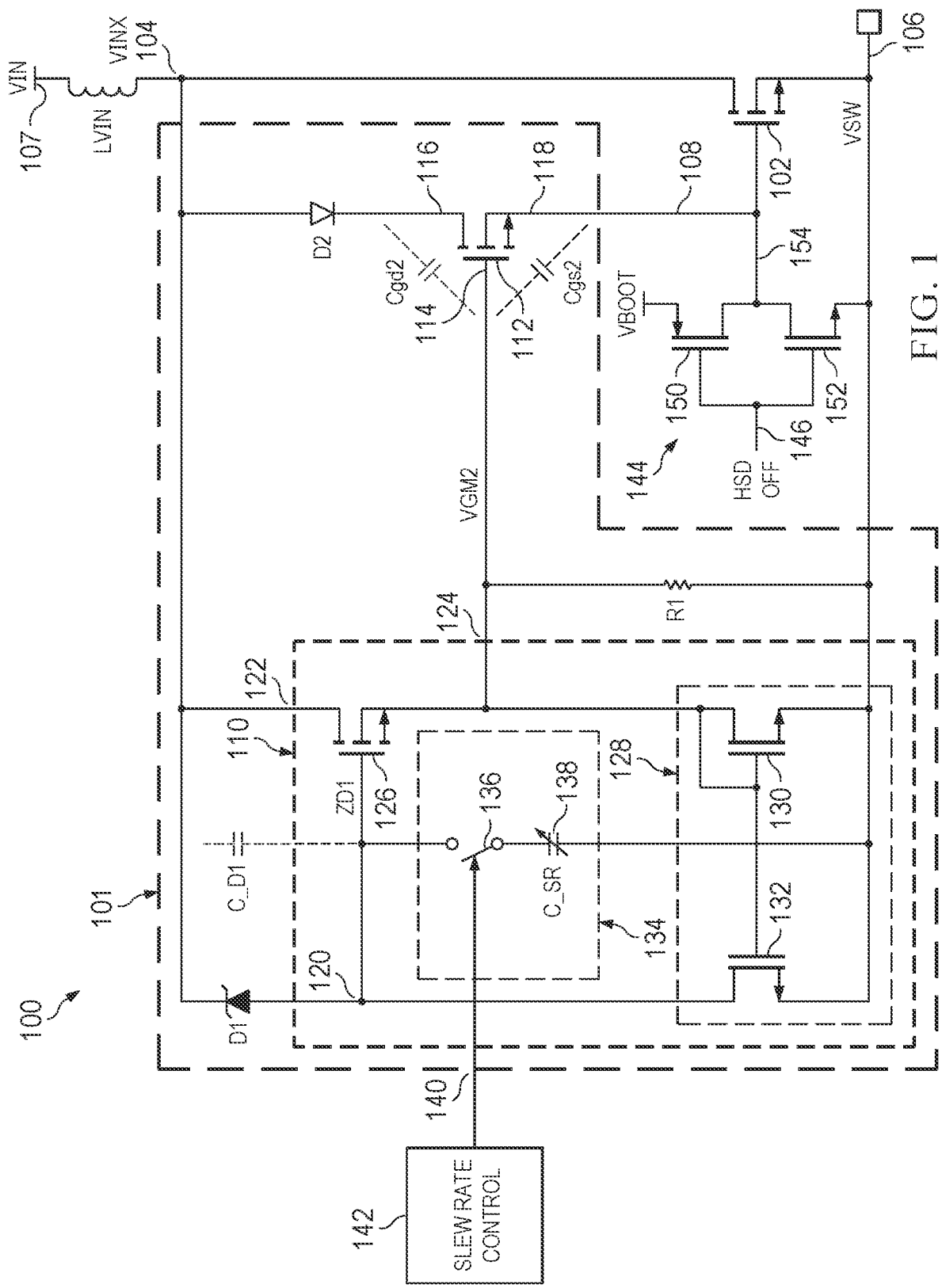
FIG. 1 is a schematic diagram of an example power converter circuit configured to implement slew rate control for a transistor.

FIG. 1 is a schematic diagram of an example power converter circuit 100 that includes an active clamp circuit 101. The circuit 100 includes a transistor 102 coupled between an input terminal 104 and an output terminal 106, and the transistor 102 has a control input coupled to an output 108 of the clamp circuit 101 (also referred to as the clamp output). The clamp circuit 101 is also coupled between the input and output terminals 104 and 106, and is configured to implement slew rate control for the transistor 102.

The transistor 102 can be a power field effect transistor (FET), such as an n-channel FET (NFET), having a gate, source and drain. For example, the drain is coupled to the input terminal 104, the source is coupled to the output terminal 106, and the gate is coupled to the clamp output 108. In other examples, different types of transistors can be used to implement the transistor 102, such as p-channel FETs, insulated-gate bipolar transistor (IGBT), bipolar junction transistors (BJT), laterally-diffused metal-oxide semiconductor (LDMOS) transistors, and the like. In an example, the power converter circuit 100 is a half-bridge circuit, in which the transistor 102 is a high-side FET of the half-bridge circuit, and the input terminal 104 is coupled to an input voltage terminal 107 through a parasitic inductor LVIN. This parasitic inductor can be an effect of the package lead frame, or the printed circuit board layout. The input terminal 104 can be configured to supply an input voltage to the circuit 100, shown as VINX, responsive to an input voltage VIN at terminal 107. The transistor 102 is configured to provide an output voltage VSW at the output terminal 106 responsive a control signal at the control input (e.g., gate) thereof.

The active clamp circuit 101 includes an avalanche diode D1, a buffer stage 110 and a clamping transistor 112. The clamping transistor 112 has a control input 114 and first and second terminals 116 and 118. The terminal 116 is coupled to the input terminal 104 and the terminal 118 is coupled to the control input of the transistor 102. In an example, the clamping transistor 112 is an NFET having a gate (e.g., the control input 114), source (terminal 118) and drain (terminal 116), in which the drain 116 is coupled to the input terminal 104 through a diode D2 and the source 118 is coupled to the clamp output 108. The clamping transistor 112 is thus configured to provide a clamp signal at the clamp output 108 to the gate of the NFET 102 responsive to a buffer output signal at 114. The diode D2 can be configured to block current flow to the terminal 116 of clamping transistor when the voltage at the clamp output 108 (the gate of transistor 102) is greater than VINX, an operation encountered when the gate of transistor 102 is driven high.

The avalanche diode D1 has an anode coupled to an input 120 of the buffer stage 110 and a cathode coupled to the input terminal 104. The buffer stage 110 also has a power input 122 and a buffer output 124. The power input 122 is coupled to the input terminal 104 and the buffer output 124 is coupled to the control input 114 of the clamping transistor 112. In an example, the buffer stage 110 includes a transistor (e.g., an NFET) 126 having a gate, source and drain, in which the gate is coupled to the buffer input 120, the source is coupled to the buffer output 124 and the drain is coupled to the power input 122.

A loop circuit 128 is coupled between the buffer output 124 and the buffer input 120. In the example of FIG. 1, the loop circuit 128 is a current mirror circuit having a first current path coupled between the buffer output 124 and the output terminal 106 and a second current path coupled between the buffer input 120 and the output terminal 106. The current mirror includes an arrangement of transistors (e.g., FETs) 130 and 132. For example, the transistor 130 is configured as a diode-connected FET having a gate and drain coupled to the buffer output 124, and a source coupled to the output terminal 106. The gate of transistor 132 has a gate coupled to the gate of transistor 130, a source coupled to the output terminal 106, and a drain coupled to the gate of the buffer transistor 126. The loop circuit 128 is configured to provide feedback at the buffer input 120 to bias the control input (e.g., gate) of the buffer transistor 126 by mirroring the current through transistor 130 responsive to operation of the buffer transistor 126, which provides the buffer output signal at the buffer output 124. In the example of FIG. 1, a resistor R1 is coupled between the buffer output 124 and the output terminal 106. R1 is configured to provide path to discharge the voltage at 124 when the current mirror is not conducting at low gate-to-source voltage (Vgs). R1 can be implemented as a polysilicon resistor on a substrate implementing the clamp circuit 101.

As an example, while the avalanche diode D1 is not conducting (e.g., VINX relative to VSW is below the breakdown voltage of D1) and the buffer transistor 126 is off, the buffer input 120 has a high-impedance condition. In some cases, a resistor (e.g., having a resistance value, such as several Mega-Ohms) can be connected between the buffer input 120 and output terminal 108 to bleed the high impedance node at 120 and keep the buffer transistor 126 off when the diode D1 is not conducting. The diode D1 is configured to activate responsive to VINX to ZD1 voltage differential exceeding the breakdown voltage of D1, such as responsive to when the transistor 102 is turned off, and the parasitic inductor LVIN reacts to the current change when transistor 102 is turned off. When the avalanche diode D1 is thus activated, D1 is configured to pull up on the buffer input 120 in order to activate the clamp circuit and ensure that the drain-to-source voltage of transistor 102 does not rise, but instead remains within its safe operation area. The buffer transistor 126 is configured to provide an input current to the current mirror 128 responsive to the voltage at 120 exceeding the turn-on voltage of the transistor 126. When the buffer transistor 126 turns on, the voltage at the buffer output 124 also increases, which activates the clamp transistor 116 to engage transistor 102 in order to slow the increase of VINX at 104. While it is important to activate the clamping circuit when the voltage across D1 exceeds its avalanche breakdown, resulting from excessive VINX-to-VSW voltage, it is also desirable to limit the activation of D1 when VINX-to-VSW voltage is still well within a safe operating area. For example, when transistor 102 is turned off, the voltage VSW at 106 reduces and the voltage VINX at 104 increases. This action will tend to activate the buffer stage 110 due to the parasitic coupling from the parasitic capacitance C_D1 responsive to a sudden increase of VINX. However, once the voltage at VSW at 106 reduces below a threshold level, the buffer loop, which includes transistors 126, 130 and 132, turns on and is configured to collapse the gate of transistor 124 because the diode D1 is still off. The Vgs of transistor 126 remains off. It is not until the breakdown voltage of the diode D1 is exceeded that the gate of transistor 126 is pulled up to activate the clamp.

The circuit 100 also includes a capacitor circuit 134 having a capacitance C_SR coupled between the input 120 of the buffer stage 110 and the output terminal 106. For example, the capacitor circuit 134 is a variable capacitor including a switch circuit 136 coupled in series with a capacitor network 138 between the buffer input 120 and output terminal 106. The capacitor circuit 134 also has a capacitance selection input 140, and the circuit 100 includes slew rate control circuitry 142 having a control output coupled to the capacitance selection input 140. The slew rate control circuitry 142 is configured to provide a control signal to the selection input 140, such as responsive to a condition of the circuit 100. The capacitor circuit 134 is configured to control (e.g., adjust) the capacitance C_SR of the capacitor circuit 134 responsive to the control signal. The capacitance C_SR can remain constant or it can vary during circuit operation responsive to the control signal. In other examples, the capacitor circuit 134 can be a single capacitor having the capacitance C_SR coupled between the buffer input 120 and the output terminal 106.

The avalanche diode D1 also has a capacitance (e.g., a parasitic capacitance), shown in dashed lines as C_D1, coupled between the buffer input 120 and the input terminal 104. The transistor 126 is configured to turn-on at a rate that depends on a ratio between the capacitances C_SR and C_D1. The clamping transistor 112 is configured to control a slew rate of the voltage across the transistor 102 (e.g., between input and output terminals 104 and 106) responsive to the buffer output signal at 124. For the example in which the transistors 102, 112 and 126 are FETs, the voltage across the FET 102 (e.g., the drain-to-source voltage (Vds) thereof) has a slew rate that depends on the turn-on rate of the FET 126, which can be controlled (e.g., by the slew rate control circuitry 142) responsive to the capacitance C_SR.

As further example, increasing C_SR relative to C_D1, causes the response time of the clamp circuit 101 to decrease. A slower response time of the clamp circuit 101 helps to resist the transistor 126 from turning on during the rate trigger, and the clamping transistor 112 can achieve a faster slew rate for the voltage across the FET 102. A faster slew rate across the FET 102 enables the circuit 100 to exhibit reduced power loss (e.g., increased efficiency). For example, a large C_SR is useful for circuit conditions when the input voltage VIN at 107 is below a specified breakdown voltage of the transistor 102 (e.g., VIN=12 V, where the breakdown voltage is about 20 V). By contrast, decreasing C_SR relative to C_D1 results in increased coupling between the buffer input 120 and the input terminal 104. The increased coupling enhances the rate trigger function, which results in a slower slew rate and less voltage peaking for the voltage across the transistor 102. For example, a smaller C_SR is useful for circuit conditions when the input voltage VIN at 107 is near a specified breakdown voltage of the transistor 102 (e.g., VIN=18 V, where the breakdown voltage is about 20 V).

Also, by implementing the buffer stage 110 with a loop circuit 128, such as described herein, the size of D1 can be reduced compared to existing typical clamp circuits. The size reduction in D1 is enabled because the buffer stage 110 is configured to isolate the clamping transistor 112 from the avalanche diode D1, and the buffer stage instead is configured to drive the clamping transistor responsive to VINX having a voltage level to trigger of D1.

The circuit 100 can also include a driver circuit 144 having a drive input 146 and a drive output 148. The drive output 148 is coupled to the control input (e.g., gate) of the transistor 102. The drive input 146 can be coupled to a controller or other control circuitry. In an example, the driver circuit 144 is an inverter that includes respective transistors 150 and 152. The transistor 150 can be a PFET and the transistor 152 can be an NFET, in which the transistors have a common gate and a common drain. Also, the source of PFET 150 is coupled to a DC drive voltage terminal 154 and the source of NFET 152 is coupled to the output terminal 106. The half-bridge circuit is configured to provide the output voltage VSW (e.g., a switching output voltage) at the output terminal 106 responsive to a drive control signal at the control input of the transistor 102.

As described herein, the clamp circuit 101 allows the slew rate of the voltage (e.g., a drain to source voltage) across the transistor 102 to be easily adjusted (e.g., responsive to the capacitance C-SR) as a function of circuit operating conditions, such as input supply voltage VIN, load current, etc. The clamp circuit 101 also enables the use smaller area components and thus less silicon area when compared to existing clamp circuit designs. The approach further enables efficiency improvements when the input supply voltage VIN is within the recommended conditions, while also addressing safe operating area limitations when VIN is at or near a maximum voltage rating for the circuit 100.

Figure 2:
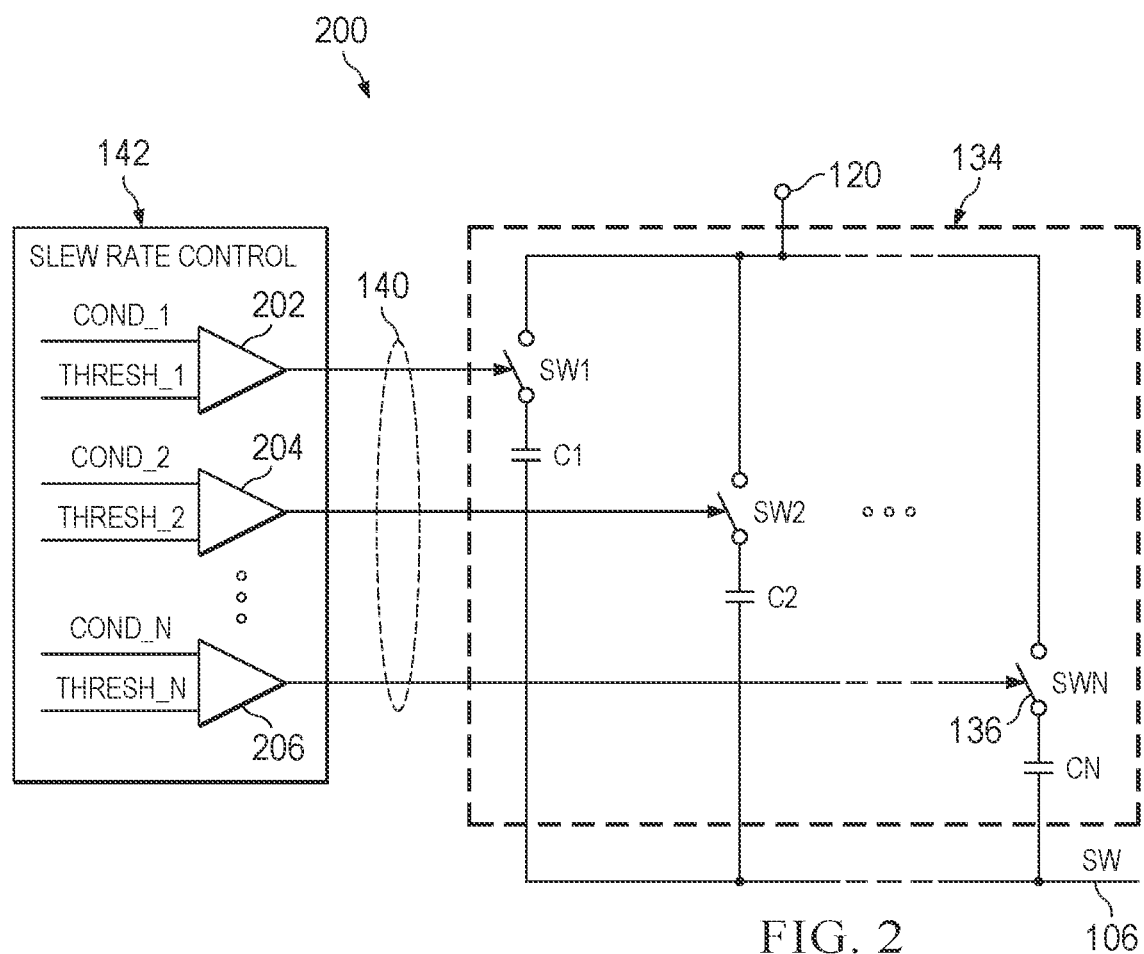
FIG. 2 is a block diagram of an example slew rate control circuit.

FIG. 2 is a block diagram of a slew rate circuit 200. The circuit 200 includes useful examples of the slew rate control circuitry 142 and the capacitor circuit 134 shown in FIG. 1. Accordingly, the description of FIG. 2 also refers to FIG. 1. The capacitor circuit 134 includes a plurality of capacitors shown as C1 through CN, where N is a positive integer (N≥1) representative of the number of capacitors. The capacitors C1 through CN are coupled in parallel between the buffer input 120 and the output terminal. The capacitor circuit 134 also includes switch circuit 136. The switch circuit 136 includes a respective switch SW1 through SWN coupled between the buffer input and each of the capacitors C1 through CN.

In the example of FIG. 2, the slew rate control circuitry 142 includes an arrangement of comparators 202, 204 and 206. The comparators 202, 204 and 206 each has an output coupled to a control input of a respective one of the switches SW1 through SWN. In the example of FIG. 2, there are N comparators—one coupled to each of the respective switches SW1 through SWN. The control inputs of the switches SW1 through SWN collectively form the selection input 140, shown in FIG. 1. Each of the comparators 202, 204 and 206 also has inputs configure to receive respective signals, in which one signal is representative of a circuit condition and another signal is representative of a threshold value for the respective condition. For example, a first condition signal COND_1 is received at a first input the comparator 202 and a first threshold signal THRESH_1 is received at a second input of the comparator 202. Similarly, a second condition signal COND_2 and a second threshold signal THRESH_2 are received at respective inputs of the comparator 204, and an Nth condition signal COND_N and an Nth threshold signal THRESH_N are received at respective inputs of the Nth comparator 206. The slew rate control circuitry 142 include any number of one or more comparators configured to adjust the slew rate for the voltage across transistor 102 (e.g., Vds across terminals 104 and 106).

As described herein, the slew rate control circuitry 142 is configured to activate one or more of the respective switches SW1 through SWN to couple one or more respective capacitors C1 through CN into the circuit path between the buffer input 120 and output terminal 106 responsive to one or more circuit conditions. One or more of the N circuit conditions can be representative of the input supply voltage VIN (e.g., the same condition) and respective thresholds can be configured to set one or more voltage thresholds. Additionally, or alternatively, one or more of the N circuit conditions can be representative of the load current and respective thresholds can be configured to set one or more load current thresholds. Additionally, or alternatively, one or more of the N circuit conditions can be representative of circuit temperature and respective thresholds can be configured to set one or more temperature thresholds. Additionally, or alternatively, one or more of the N circuit conditions can be representative of process parameters (e.g., front end of line and/or back end of line process corners) and respective thresholds can be configured to set one or more thresholds representative of different values of such process parameters. The slew rate control circuitry 142 can thus be configured to switch into the circuit one or more of the capacitors C1 through CN into the circuit path between the buffer input 120 and output terminal 106 to achieve an effective slew rate responsive to one or more detected conditions.

As an example, assuming the circuit 100 has a maximum rating voltage of 18 V and a recommended operating voltage up to 14 V, THRESH_1 can have a value representative of 14 V, another threshold THRESH_2 can have a value of 16 V (e.g., slightly below the maximum voltage rating). Also, COND_1 and COND_2 each can be representative of the same input supply voltage VIN, which can be measured by a voltage detection circuit coupled to the input voltage terminal 107. Other thresholds likewise can be set to other voltage values within the operating voltage supply range for the circuit 100. For purposes of this example it is assumed that C1 is greater than C2. Also, assume that C1 is larger than CD1, and C2 is smaller than CD1. Thus, if the input voltage VIN is less than or equal to 14 V, for example 12 V, the comparator 202 is configured to provide a control signal to SW1 to couple capacitor C1 between the buffer input 120 and output terminal 106. Since C1 is larger than CD1, the coupling effect of rising VINX to the gate signal 120 of buffer 126 is reduced, thus reducing the response time of the clamp 101. Hence the slew rate switching of transistor 102 is fast, thus reducing power losses, or results in an increased efficiency. Alternatively, if the input voltage VIN is equal to or greater than 16 V, the comparator 204 is configured to provide a control signal to SW2 to couple capacitor C2 between the buffer input 120 and output terminal 106. Because in this example C2 is less than CD1, and therefore less than C1, the coupling effect of rising VINX to the gate signal 120 of buffer 126 is increased, thus increasing the response time of the clamp. Thus, the slew rate switching of transistor 102 is slow. The slow slew rate of transistor 102 increases power losses; however, that is acceptable because the safe operation of the power transistor 102 is an overriding concern at such high input.

In addition, or as an alternative to the input supply voltage VIN, the slew rate control circuitry 142 can be configured to adjust the slew rate by controlling the capacitance of the capacitor circuit 134 one or more other conditions. For example, the slew rate control circuitry 142 can be configured to reduce slew rate for circuit conditions reflecting strong process corners, which can be programmed into the circuit (e.g., by setting a register entry to specify a value representative of the process corner condition(s)). The slew rate control circuitry 142 can also be configured to adjust slew rate responsive to temperature. For example, one or more temperature sensors can be configured to provide a signal representative of temperature of the circuit 100 to a respective condition input. The comparator (e.g., one or more of 202, 204 or 206) is configured to compare the temperature signal with an appropriate temperature threshold received at a respective threshold input, to determine whether to adjust the capacitance of the circuit 134.

Figure 3:
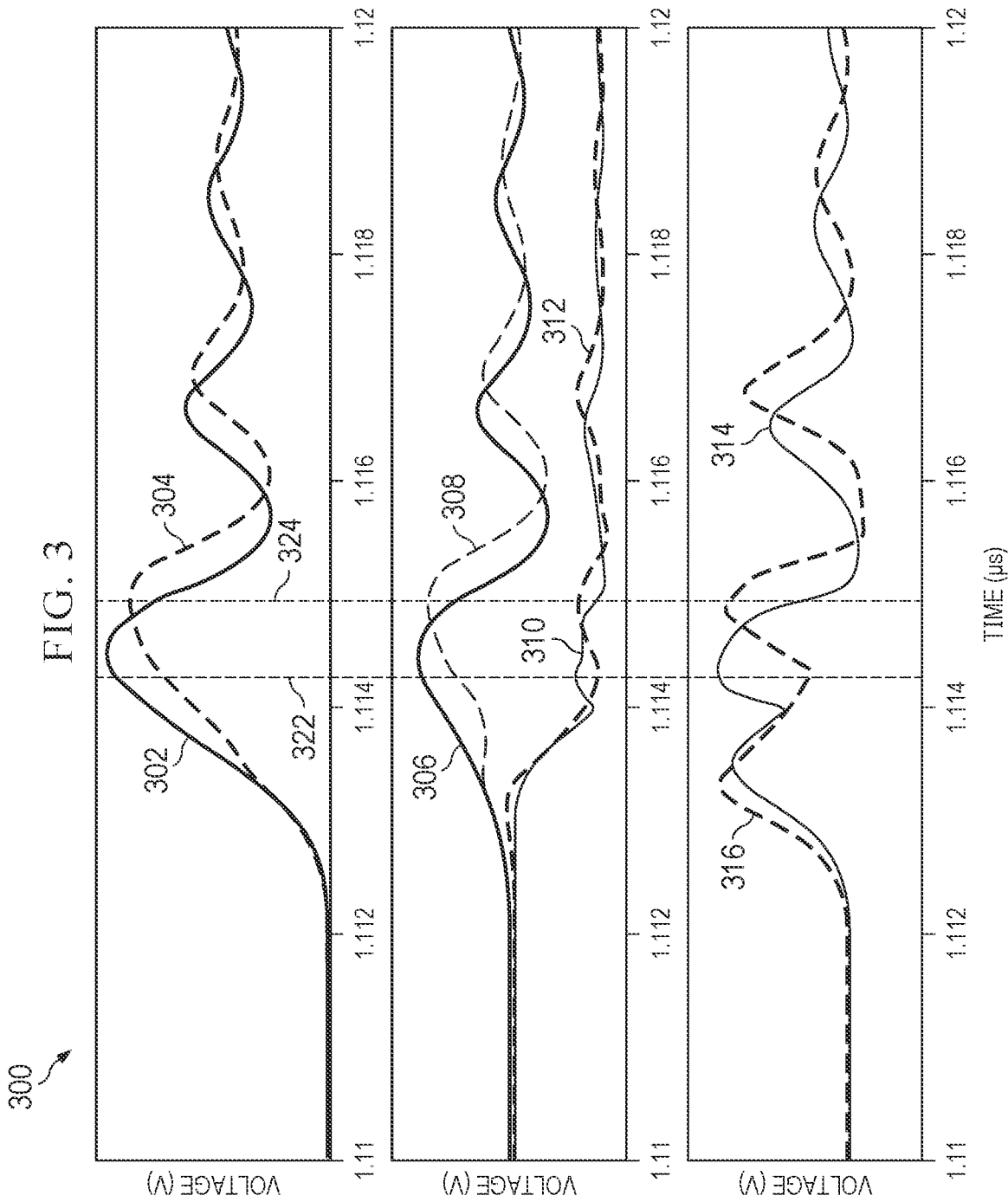
FIG. 3 is a signal diagram showing examples of some signals in the circuit of FIG. 1.

FIG. 3 is a signal diagram 300 showing examples of some signals in the circuit 100 of FIG. 1. Accordingly, the description of the signal diagram 300 also refers to FIG. 1. The signals in the diagram 300 show respective signal responses responsive to the transistor 102 being turned off and when different capacitances are coupled between the buffer input 120 and the output terminal 106, such by configuring the capacitor circuit 134 with different capacitance values C_SR.

Signal plots 302 and 304 are representative of the voltage across the transistor 102 responsive to the transistor 102 being turned off (e.g., by driver circuit 144) for different capacitance values C_SR. For example, the signal plot 302 shows Vds across FET 102 for C_SR=2 pF and signal plot 304 shows Vds across FET 102 for C_SR=0.1 pF. A comparison of the signal plots 302 and 304 demonstrates that an increased slew rate when increased capacitance at 134 is increased. For example, the slew rate of Vds for C_SR=2 pF is approximately 18 V/ns whereas the slew rate of Vds for C_SR=0.1 pF is approximately 12 V/ns. The ringing and oscillation shown in the waveforms of FIG. 3 is caused by the parasitic inductance and capacitance in the circuit 100.

The signal diagram 300 also includes plots of the voltage VINX at 104, shown at 306 and 308, and plots of the voltage at the buffer input (VBI) 120, shown at 310 and 312, responsive to the transistor 102 being turned off. The plots 306, 308, 310 and 312 are representative of the respective signals for the same conditions as the signals 302 and 304. Specifically, the signal plots 306 and 310 are representative of respective VINX and VBI signals when the clamp circuit 101 includes a larger capacitance (e.g., C_SR=2 pF) and the signal plots 308 and 312 are representative of respective VINX and VBI signals when the clamp circuit 101 includes a smaller capacitance (e.g., C_SR=0.1 pF). As shown in signal plots 306 and 308, VINX exhibits a more gradual increase after its initial rise for the larger capacitance compared to when a smaller capacitance is used. Also, when a smaller capacitance C_SR is used, the signal plot 312 for VBI increases initially responsive to the transistor 102 being turned off (e.g., due to increased coupling through the diode capacitance C_D1) compared to the when a larger capacitance C_SR is used.

The signal diagram 300 includes signal plots 314 and 316 representative of the voltage across the capacitor circuit 134 (e.g., VBI-VSW) for different capacitance values C_SR responsive to the transistor 102 being turned off. The signal plot 314 is representative of when the clamp circuit 101 includes a larger capacitance (e.g., C_SR=2 pF) and the signal plot 316 is representative of when the clamp circuit 101 has a smaller capacitance (e.g., C_SR=0.1 pF). A larger capacitance C_SR also results in a faster trigger of the avalanche diode D1, as shown at 322, compared to the trigger of D1 when a smaller capacitance C_SR is used, as shown at 324.

Figure 4:
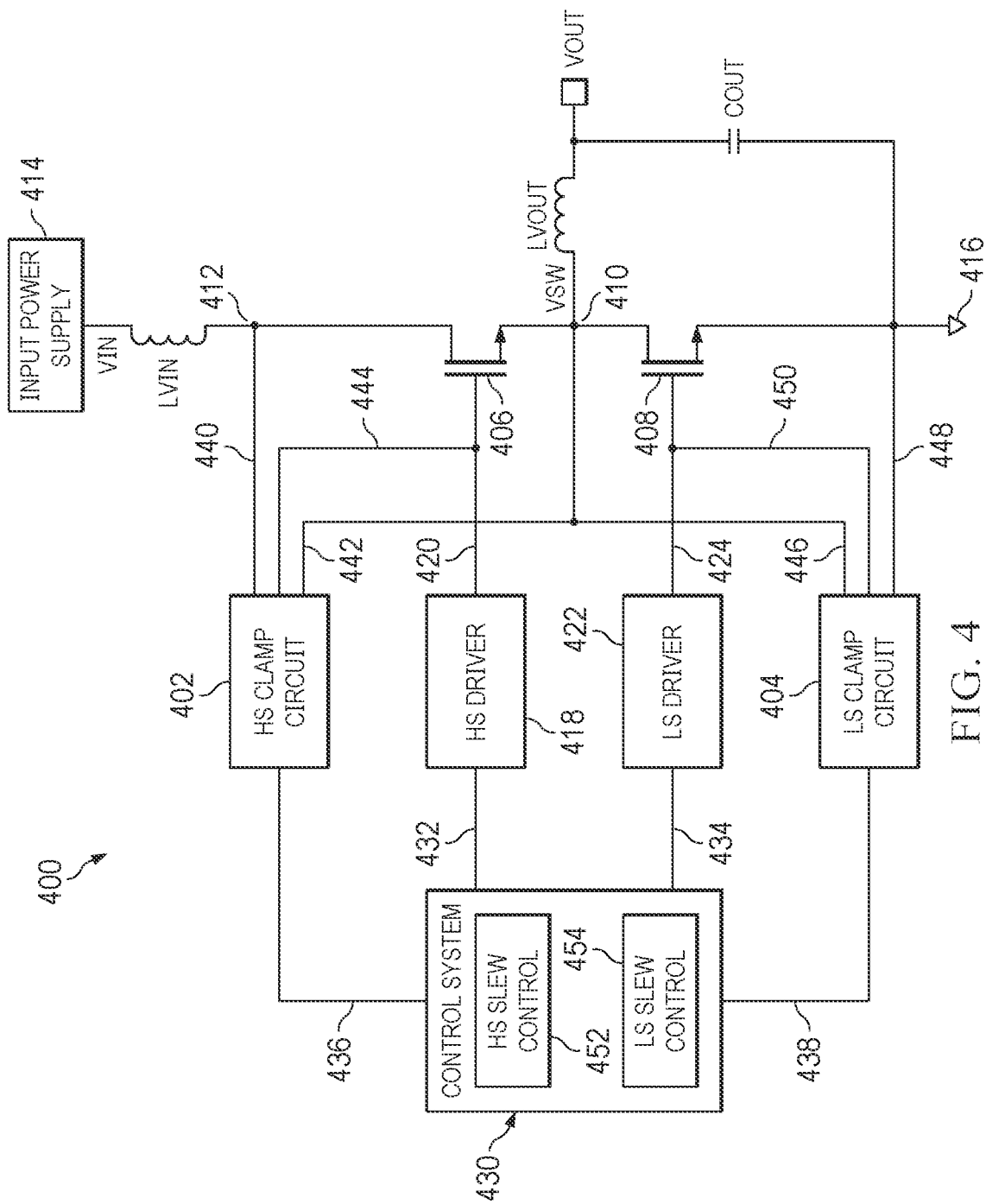
FIG. 4 is a schematic block diagram of another example power converter circuit configured to implement slew rate control.

FIG. 4 is a schematic block diagram of another example circuit 400 configured to implement a power converter (e.g., a buck regulator, a boost regulator, a buck-boost regulator or other regulator). The circuit 400 includes clamp circuits 402 and 404 configured to implement slew rate control for respective transistors 406 and 408, as described herein. For example, each of the clamp circuits 402 and 404 can be implemented as an instance of the clamp circuit 101 described herein. The circuit 400 can be implemented on one or more IC die, as a system on chip (SOC) or on a printed circuit board containing one or more IC die and/or an arrangement of discrete components.

In the example of FIG. 4, the transistors 406 and 408 are NFETs (e.g., power NFETs). In other examples, different types of transistors may be used, such as described herein. The NFETs 406 and 408 are configured as a half-bridge circuit, in which the NFET 406 is a high-side NFET and the NFET 408 is a low-side NFET. For example, NFET 406 has a drain coupled to an input terminal 412 and a source coupled to the output terminal 410. The input terminal 412 can be coupled to an input power supply 414 through an inductor LVIN. The input power supply 414 can be configured to provide an input supply voltage VIN (e.g., a regulated DC voltage) for the circuit 400. The NFET 408 has a drain coupled to the output terminal 410 and a source coupled to a ground terminal 416.

The circuit 400 also includes a high-side driver 418 having an output 420 coupled to a gate of the NFET 406. A low-side driver 422 has an output 424 coupled to gate of NFET 408. The control system 430 has outputs 432 and 434 coupled to inputs of the respective drivers 418 and 422. The control system 430 can implement one or more control loops configured to provide respective control signals (e.g., pulse-width modulated signals) to inputs of the drivers 418 and 422 for commanding an increase or decrease in output power (e.g., voltage and/or current) at the output terminal 410. The drivers 418 and 422 are thus configured to supply drive signals at the respective gates of the NFETs 406 and 408 responsive to the control signals.

The control system 430 also includes outputs 436 and 438 coupled to the respective clamp circuits 402 and 404. The control system 430 can also have one or more inputs (not shown) coupled to the output terminal 410, the input terminal 412, a temperature sensor, and other parts of the circuit 400 to receive a measure of VSW, VIN, load current at 410, circuit temperature and other circuit conditions.

The high-side clamp circuit 402 has first and second terminals 440 and 442 coupled to the input terminal 412 and the output terminal 410. The clamp circuit 402 also has an output 444 coupled to the gate of NFET 406. Similarly, the low-side clamp circuit 404 has a first terminal 446 coupled to the output terminal 410, a second terminal 448 coupled to the ground terminal 416, and an output terminal 450 coupled to the gate of NFET 408.

The control system 430 also includes slew control circuitry, shown as high-side slew control 452 and low-side slew control 454. Each of the slew control circuits 452 and 454 can be implemented by the slew rate control circuitry 142, described herein with respect to FIGS. 1 and 2. For example, the high-side slew control 452 is configured to provide a slew control signal to set a capacitance of a capacitor circuit, such as an instance of the circuit 134, implemented in the high-side clamp circuit 402. Similarly, the low-side slew control 454 is configured to provide a slew control signal to set a capacitance of a capacitor circuit, such as an instance of the circuit 134, implemented in the low-side clamp circuit 404. As described herein, the clamp circuits 402 and 404 are configured to control the slew rate of the voltage (e.g., Vds) across the respective transistors 406 and 406 responsive to the value of capacitance (e.g., C_SR). By implementing slew control and clamp circuits for each of the high-side and low-side FETs, as described herein, the circuit 400 can achieve efficiency improvements at lower VIN levels while also ensuring safe operation of the circuit when VIN is at or near the maximum rated value for the input supply voltage VIN.

In this description, numerical designations "first", "second", etc. are not necessarily consistent with same designations in the claims herein. Additionally, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A circuit comprising:
   an avalanche diode having an anode and a cathode;
   a buffer stage having a buffer input, a power input and a buffer output, in which the buffer input is coupled to the anode, and the cathode is coupled to the power input, wherein the buffer stage includes:
      a loop circuit coupled between the buffer output and the buffer input; and
      a capacitor coupled between the buffer input and an output terminal; and
   a transistor coupled between the power input and a clamp output, the transistor having a control input coupled to the buffer output.

2. The circuit of claim 1, wherein the capacitor is a variable capacitor having a capacitance selection input, and the circuit comprises slew rate control circuitry having a control output coupled to the capacitance selection input.

3. The circuit of claim 2, wherein the slew rate control circuitry is configured to provide a control signal at the control output, and the circuit is configured to adjust a capacitance of the variable capacitor responsive to the control signal.

4. The circuit of claim 1, wherein the buffer stage includes a field effect transistor (FET) having a gate, a source and a drain, in which the gate is coupled to the buffer input, the drain is coupled to the power input, the source is coupled to the buffer output.

5. The circuit of claim 4, wherein the avalanche diode is coupled between the gate and the drain.

6. The circuit of claim 5, wherein the FET is a first FET, the gate is a first gate, the source is a first source, the drain is a first drain, and the circuit further comprises:
   a second FET coupled between the power input and the output terminal, the second FET having a second gate, a second source and a second drain, in which the second gate is coupled to the clamp output, the second drain is coupled to the power input, and the second source is coupled to the output terminal.

7. The circuit of claim 6, further comprising a gate driver circuit having a drive input and a drive output, in which the drive output is coupled to the second gate.

8. The circuit of claim 6, wherein the capacitor has a first capacitance, the avalanche diode has a second capacitance, a turn-on rate of the first FET depends on a ratio between the first and second capacitances, and a drain-to-source voltage of the second FET has a slew rate that depends on the turn-on rate.

9. The circuit of claim 8, wherein the loop circuit includes a current mirror having a first current path and a second current path, the first current path is coupled between the first source and the output terminal, and the second current path is coupled between the first gate and the output terminal.

10. The circuit of claim 6, wherein the transistor is a third FET having a third gate, a third source and a third drain, in which the third gate is the control input, the third source is coupled to the second gate, and the third drain is coupled to the power input.

11. The circuit of claim 1, wherein the transistor is a first transistor and the control input is a first control input, and the circuit further comprises a second transistor coupled between the power input and the output terminal, in which the second transistor has a second control input coupled to the clamp output.

12. A circuit comprising:
a buffer stage coupled between an input terminal and an output terminal, the buffer stage configured to provide a buffer signal responsive to a voltage at the input terminal, a voltage at the output terminal, and the buffer stage is configured to turn on and provide the buffer signal at a rate that depends on a capacitance at a buffer input, wherein the buffer stage includes a loop circuit configured to control the buffer stage, and a capacitor coupled to the buffer input;
an avalanche diode coupled between the buffer input and the input terminal, the avalanche diode configured to conduct a reverse bias current responsive to a voltage at the input terminal exceeding a breakdown voltage of the avalanche diode, wherein the loop circuit is configured to bias the avalanche diode responsive to operation of the buffer stage; and
a clamping transistor configured to provide a clamping signal responsive to the voltage at the output terminal and the buffer signal.

13. The circuit of claim 12, wherein the buffer stage includes a buffer transistor having a control input coupled to an anode of the avalanche diode, a voltage input coupled to the input terminal and an output coupled to a gate of the clamping transistor.

14. The circuit of claim 13, wherein the loop circuit includes a current mirror coupled between the output of the buffer transistor and the control input of the buffer transistor, the current mirror configured to mirror current through the buffer transistor to the control input of the buffer transistor to regulate the buffer stage responsive to operation of the buffer stage and a state of the avalanche diode.

15. The circuit of claim 12, further comprising:
slew rate control circuitry configured to set the capacitance responsive to an operating condition of the circuit.

16. The circuit of claim 15, wherein the operating condition includes at least one of the voltage at the input terminal, a temperature of the circuit or a process corner of the circuit.

17. The circuit of claim 12, further comprising:
an output transistor coupled between the input terminal and the output terminal; and
a driver configured to drive the output transistor responsive to a control signal.

18. The circuit of claim 12 implemented as an integrated circuit, in which the avalanche diode, the clamping transistor, the buffer stage and the capacitor are implemented on a common substrate.

19. A system comprising:
a first transistor having a first control input and coupled between an input terminal and an output terminal;
a driver having a driver output coupled to the first control input; and
a clamp circuit including:
a second transistor having a second control input, the second transistor coupled between the input terminal and the first control input;
an avalanche diode having an anode and a cathode, the cathode coupled to the input terminal;
a buffer stage having a buffer input, a power input and a buffer output, the buffer input coupled to the anode, the power input coupled to the input terminal, and the buffer output coupled to the second control input, wherein the buffer stage includes:
a loop circuit coupled between the buffer output and the buffer input; and
a capacitor coupled between the buffer input and the output terminal.

20. The system of claim 19, wherein the capacitor is a variable capacitor, and the system includes slew rate control circuitry configured to set a capacitance of the variable capacitor to control a slew rate of a voltage across the first transistor responsive to the first transistor being turned off.

* * * * *